United States Patent
Schoenfish

(10) Patent No.: US 6,370,037 B1
(45) Date of Patent: Apr. 9, 2002

(54) RELEASABLE MOUNT FOR AN ELECTRIC DEVICE

(75) Inventor: Brian G. Schoenfish, Kansas City, KS (US)

(73) Assignee: Garmin Corporation (TW)

( * ) Notice: Subject to any disclaimer, the term of this patent is extended or adjusted under 35 U.S.C. 154(b) by 0 days.

(21) Appl. No.: 09/397,567

(22) Filed: Sep. 16, 1999

(51) Int. Cl.[7] .................................................. H05K 7/02
(52) U.S. Cl. ........................ 361/807; 361/802; 361/809; 361/801; 174/52.1; 248/223.1; 248/223.2
(58) Field of Search ................... 361/807, 801, 361/815, 823, 825, 802, 809, 728, 694; 439/558, 350, 353, 358, 35, 373; 248/671, 672, 917, 918, 27.1, 27.3; 312/7.2, 242, 223.1, 223.3; 174/52.1

(56) References Cited

U.S. PATENT DOCUMENTS

| 3,946,826 | A | | 3/1976 | Guhl et al. .................... 180/90 |
| 4,058,357 | A | | 11/1977 | Wallace ..................... 339/12 R |
| 4,061,971 | A | | 12/1977 | Barrons ........................ 325/15 |
| 4,079,604 | A | | 3/1978 | Anderegg ...................... 70/58 |
| 4,083,620 | A | | 4/1978 | Burgin ..................... 339/91 R |
| 4,131,772 | A | | 12/1978 | Weckenmann et al. .. 200/61.54 |
| 4,648,665 | A | * | 3/1987 | Davis et al. ................. 439/573 |
| 4,758,817 | A | | 7/1988 | Akiyama ..................... 340/63 |
| 5,048,733 | A | | 9/1991 | Nagy ....................... 224/42.42 |
| 5,169,097 | A | * | 12/1992 | Yasukawa ..................... 248/27 |
| 5,169,105 | A | | 12/1992 | Ysukawa ................. 248/205.2 |
| 5,467,947 | A | | 11/1995 | Quilling, II ................. 248/27.1 |
| 5,573,164 | A | | 11/1996 | Law ........................... 224/483 |
| 5,713,752 | A | * | 2/1998 | Leong et al. ............... 439/358 |
| 5,826,836 | A | | 10/1998 | Gallichan et al. .......... 248/27.3 |
| 5,860,573 | A | | 1/1999 | Hossack et al. ............ 224/483 |
| 5,865,403 | A | | 2/1999 | Covell ....................... 248/27.1 |
| 5,879,173 | A | * | 3/1999 | Poplawski et al. .......... 438/138 |

* cited by examiner

Primary Examiner—Jayprakash N. Gandhi
Assistant Examiner—Hung Bui
(74) Attorney, Agent, or Firm—Devon A. Rolf

(57) ABSTRACT

An apparatus is provided for removably mounting an electronic device to the dashboad of a vehicle. The apparatus includes a mount securable to the electronic device and a cradle fixed to the vehicle for receipt of the mount. The mount includes a plate for attachment to the electronic device and at least one flexible locking arm extending from said plate. The outwardly biased arm engages the cradle when the mount is secured to the cradle. The arm is deflected inwardly to allow the electronic device to be quickly and easily removed from the dashboard of the vehicle in a single motion.

11 Claims, 2 Drawing Sheets

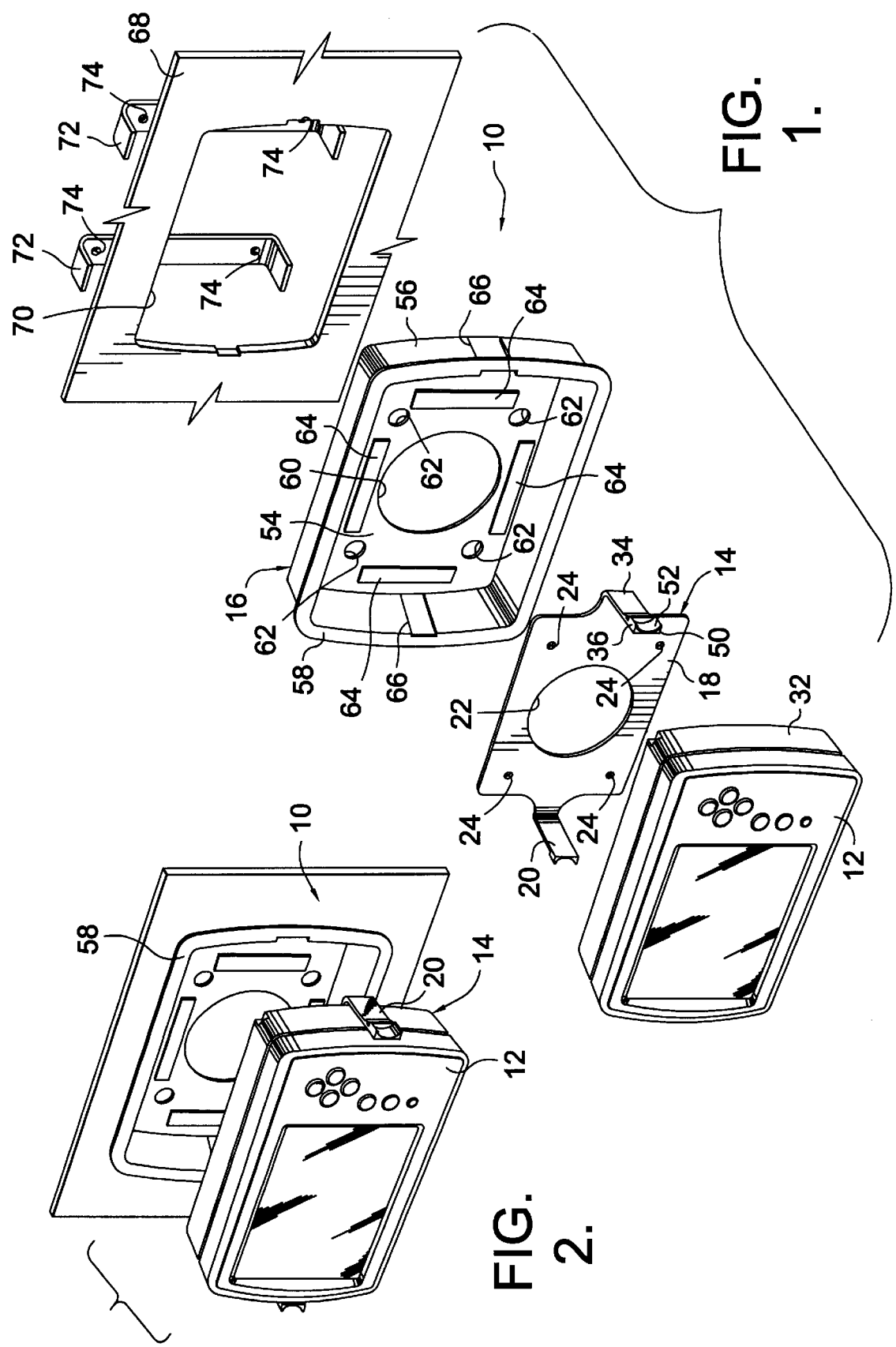

RELEASABLE MOUNT FOR AN ELECTRIC DEVICE

BACKGROUND OF THE INVENTION

The present invention relates to a mounting apparatus for an electronic device. More particularly, the present invention is directed to an apparatus for releasably mounting an electronic device in a dashboard, such as the dashboard of an aircraft, marine craft, or land vehicle.

Electronic devices are conventionally used in a variety of vehicles. For example, global positioning satellite (GPS) devices are currently used for navigational purposes in automobiles, aircraft, boats and other vehicles. Another example of a commonly used electronic device is a sonar depth sounder. Sonar depth sounders allow a user of a marine craft to profile the bottom of the marine body on which the craft is located and identify the depth and position of wildlife such as fish. In some instances, GPS components may be integrated with the sonar depth sounder device. A number of other commonly used devices include communications devices, such as two-way radios or telephones and entertainment devices, such as televisions and radios.

Oftentimes, it is desirable to remove these electronic devices from the vehicles to which the devices are mounted. For instance, some electronic GPS devices allow the user to exchange information between the device and a personal computer. Digital information such as maps may be uploaded from the personal computer to the electronic device. Additionally, information recorded by the electronic device may be transferred, or downloaded, to the personal computer. Generally, it is less burdensome to remove the electronic device from the vehicle than to move the computer into proximity with the device when it is mounted on the vehicle.

A number of the other advantages are achieved by having the capability to remove the electronic device from the vehicle. First, the device may be removed to prevent theft of the device. Theft is of particular concern with unguarded boats docked in public marinas. Further, in some cases, a single electronic device may be used with a number of different vehicles by transferring the device from vehicle to vehicle. Also, some electronic devices are hand held and may be advantageously used as personal devices upon removal from the boat.

Mounting of these electronic devices in a manner that accommodates removal and transport of the device presents a number of problems. Traditionally, these devices are purchased separately from the vehicle or vessel in which they will be used. The electronic device is often mounted to the dashboard or other surface of the vehicle by utilizing a number of relatively inaccessible components that make removal of the device relatively burdensome. In other instances, an electronic device is mounted on a lift bracket (or pedestal) located externally from the dashboard or desired mounting surface. Mounting on these brackets allows the device to be manipulated along at least one axis. However, the devices are not as firmly secured to the vehicle as the "in dash" mounts. Further, the positioning of the device outside of flush alignment with a surface of the vehicle leaves the device exposed to damage by outside sources. Also, when mounted on a lift bracket or pedestal, the electronic device is placed at a distance from the power sources in the dashboard area of the vehicle and may require the use of a battery.

Therefore, a mounting device is needed that can be used to mount a portable electronic device to a surface of a vehicle so that the device can be quickly and easily released from the surface. Further, a releasable mounting device is needed that allows the device to be firmly mounted to the surface. Finally, a mounting apparatus is needed that allows the user to releasably mount the device so that the outer surface of the device is generally flush with the surface to which the device is mounted.

OBJECTS OF THE INVENTION

It is an object of the present invention to provide an apparatus for mounting an electronic device so that it is easily and quickly removable.

It is a further object of the invention to provide a mounting apparatus that securely holds the device in flush communication with the dashboard of the vehicle.

Still another object of the present invention is to provide a mounting apparatus that allows the electronic device to be removed by deflecting at least one flexible locking arm from its locked position.

A still further object of the invention is to provide a removable mounting device that allows the electronic device to be used in a variety of different vehicles.

Another object of the invention is to provide a mounting apparatus that allows the electronic device to be removed from the vehicle and connected to a personal computer for transferring information.

This and other objects are achieved by a mounting apparatus including a mount securable to the electronic device and a cradle fixed to the vehicle for receipt of the mount. The mount includes a plate for attachment to the electronic device and at least one flexible locking arm extending outwardly from the plate. To secure the device to the surface, the arm is placed within a corresponding slot on the sidewall of the cradle. As the mount is slid into the cradle, the locking arm is deflected inwardly until a notch in the distal end of the arm receives a portion of the sidewall, preferably a flange positioned at the terminal end of the sidewall. In this position, the mount is firmly secured to the surface by the outwardly biased arm. To remove the device, the arm is deflected inwardly until the notch is cleared from the portion of the sidewall to which the arm was secured. The device may be easily removed by pulling the mount from the cradle.

Additional objects, advantages, and novel features of the invention will be set forth in part in the description which follows, and in part will become apparent to those skilled in the practice of the invention. The objects and advantages of the invention may be realized and attained by means of the instrumentalities and combinations particularly pointed out in the appended claims.

BRIEF DESCRIPTION OF THE DRAWINGS

The objects and features of the invention noted above are explained in more detail with reference to the drawings, in which like reference numerals denote like elements, and in which:

FIG. 1 is a front exploded perspective view of the releasable mounting apparatus embodying the present invention;

FIG. 2 is a front perspective view of the releasable mounting apparatus with the mount holding the electronic device detached from the cradle;

DETAILED DESCRIPTION OF THE INVENTION

Figure 3:
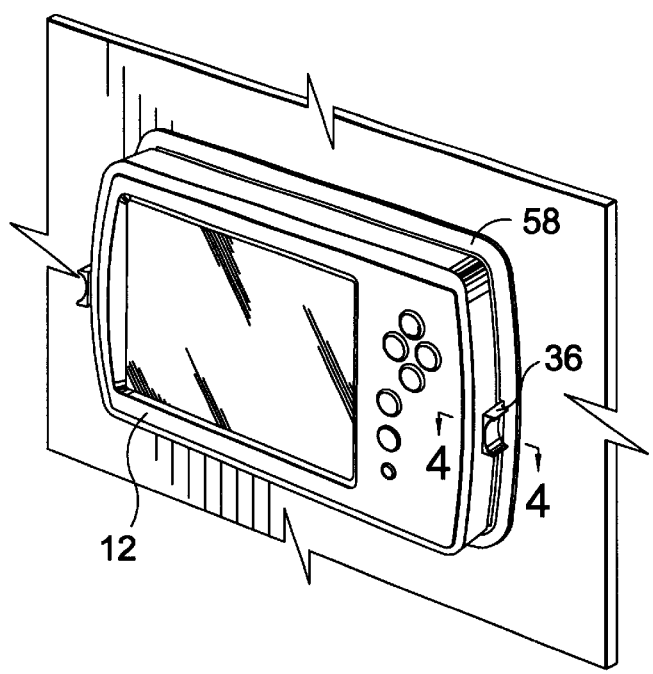
FIG. 3 is a front perspective view of an electronic device mounted in accordance with the present invention.

Referring initially to FIGS. 1 and 2, a mounting apparatus embodying the principals of this invention is broadly designated in the drawings by reference numeral 10. Apparatus 10 is used to secure an electronic device 12 on a surface, such as a vehicle dashboard. The electronic device 12 can be, for example, a global positioning satellite (GPS) device, a sonar depth finder, a communication device, a stereo, any combination thereof, and/or another conventional electronics device. Apparatus 10 includes a mount 14 and a cradle 16. As described below, cradle 16 is permanently coupled with the desired surface. Mount 14 is coupled with the electronic device 12 and is constructed to be releasably held within cradle 16.

Figure 4:
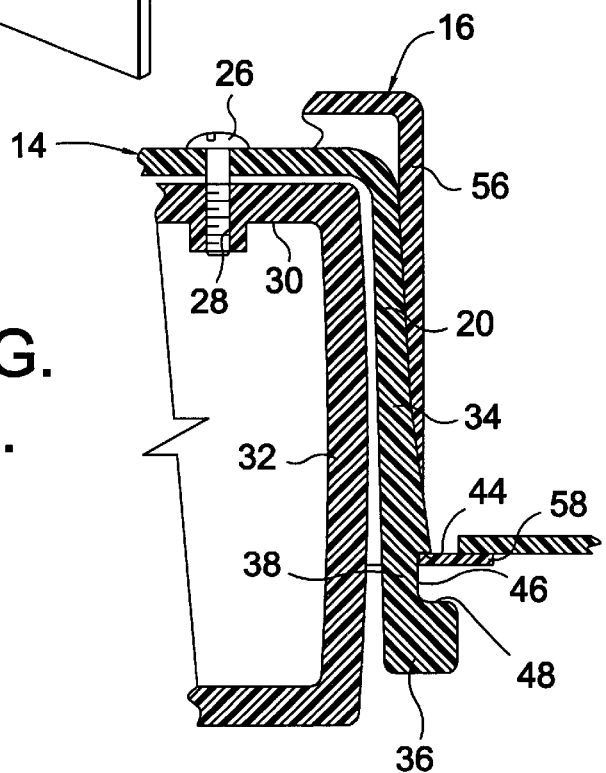
FIG. 4 is a partial side cross sectional view of the present invention taken along line 4—4 of FIG. 3.

Mount 14 has a plate 18. A pair of locking (or latching) arms 20 are extended outwardly from opposing sides of the plate. The plate and arms of the mount are preferably formed as one piece from molding a thermoplastic material. The plate 18 is generally rectangular and is rounded at the corners. A centrally located window 22 is positioned within the plate and allows a power cord, antenna or similar structure to extend through the mount 14. Preferably, a plurality of screw receiving apertures 24 are located at various points near the periphery of the plate. In the preferred embodiment, apertures 24 are located near each corner of the plate. However, the apertures may be located in any location that facilitates a firm connection between the mount 14 and the electronic device 12. As best shown in FIG. 4, a number of screws 26 are placed through the corresponding screw receiving apertures 24 and are secured within holes 28 formed within the rear wall 30 of the electronic device. Alternatively, plate 18 may be secured to the electronic device by any other suitable means such as by other frictional means and/or adhesives. Moreover, the mount 14 may be integrally formed on the electronic device 10. In this embodiment, the plate 18 could serve as the rear wall of the electronic device and the locking arms would either be integrally formed with the plate or frictionally attached thereto.

As best shown in FIGS. 1 and 4, the locking arms 20 originate at opposing sides of plate 18 and bend at a slightly obtuse angle with respect to the plate. The bent portion of each arm is preferably curved to facilitate flexibility of the arm. The locking arms 20 extend along a portion of a side wall 32 of the electronic device 12 and a small space is defined between the arms and the device. Each locking arm 20 has a downwardly tapered stem 34 and a head 36. A notched portion 38 is located between the top of the stem 34 and the base of the head 36. The notch 40 is located on the outer face 42 of the locking arm 20 at notched portion 38. The notch 40 is defined by a lower lip 44, a side wall 46 and an upper lip 48 and opens in the direction opposite electronic device 12. It should be understood that the notch may taken on any desired configuration (e.g., aperture, indent, etc.).

In the preferred embodiment, the head 36 of the locking arms 20 is shaped to define an inwardly concave gripping surface 52. Alternatively, the head 36 may be formed in the shape of a solid block or any other structure allowing the user to grasp the locking arm 20. The stem 34 is preferably made from a flexible plastic material that causes the arm to be biased to the undeflected angular position when pressure is applied at the outer face 42 of the locking arm 20, particularly, when a user depresses the locking arm at the head portion 36 by pushing at the gripping surface 52.

The cradle of mounting apparatus 10 has a base plate 54 having a number of upwardly extending side walls 56. Each side wall 56 terminates in a flange 58 that is preferably coplanar with the base plate 54. The base plate 54 and side walls 56 define an area that is sized to receive the electronic device 12 and mount 14. The side walls 56 extend at generally right angles with respect to the base plate. A pair of slots 66 are formed on opposing side walls 56. The rectangular slots 66 extend to the height of the side wall and a small distance into a portion of the flange 58. Each slot 66 is slightly wider than the width of the locking arms 20 of mount 14.

A window 60, similar to window 22 of mount 14, is located centrally within base plate 54, and serves the same purpose as window 22. A plurality of screw receiving apertures 62 are located about the periphery of the base plate 54. Strips 64 of shock absorbent material are positioned on the inner surface of base plate 54. Preferably, the strips are made from polyurethane or a material displaying similar shock absorbent characteristics. Each strip 64 has a uniform thickness that provides a barrier between the inner surface of base plate 54 and the outer surface of plate 18 when the electronic device 12 is mounted as fully described below.

Cradle 16 is placed within a window 70 formed within the surface 68 so that the inner surface of flange 58 rests upon the surface. The cradle 16 is permanently fastened to a surface 68 of the vehicle at a pair of brackets 72 located on the interior of the surface. Typically, these brackets are part of the vehicle located inside the vehicle's dashboard. A plurality of screws (not shown) are placed through the screw receiving aperture 62 of cradle 16 and are received within holes 74 placed at the appropriate locations in the brackets 72. It will be appreciated that cradle 16 may be secured to or in surface 68 in a variety of other manners.

In use, mount 14 is secured to the electronic device 12 by a plurality of screws placed within screw receiving apertures 24 and received by holes 28 formed within the electronic device. The electronic device 12 and mount 14 are then placed within cradle 16. Cable connections (such as power and antenna connections) extend from the rear of device 12 through windows 22 and 60 to appropriate connections. As the mount 14 is slid within the side walls 56 of cradle 16, the locking arms 20 deflect inwardly as the tapered stems 34 slidingly contact the flange 58. In response to this inward deflection, the locking arms 22 are biased outwardly to the undeflected shape. When the notches 40 formed within the locking arms become aligned with the slot 66 formed in flange 58, the arms deflect outwardly and lock the mount within the cradle. In the locked position, the notches 40 receive a portion of flange 58 to prevent the electronic device from sliding into or out of connection with the cradle. In this position, the plate 18 of the mount 14 is in firm connection with the strips 64 placed on the bottom of base plate 54. Thus, the frictional fit between the locking arms 20 and the cradle 16 securely hold the electronic device 12 within the surface 68 of the vehicle. The positioning of the arms and the relatively small space required for the cradle and mount allow the device to be secured in flush alignment with the surface of the vehicle.

It should also be understood that the present invention may be constructed such that flexible arms 20 have one or more protrusions, rather than notches, thereon. Such protrusions would mate with corresponding recesses in the sidewalls 56 of cradle 16. In particular, the invention may be varied to permit the mount 14, and particularly arms 20, to releasably secure within cradle 16 in other manners. Additionally, while cradle 16 is preferably formed separately from the surface (e.g. dashboard) 68, cradle 16 could be integrally formed therewith, and in fact, could be reduced to mere locking members at the periphery of the opening (e.g. window 70) in the surface 68.

To selectively remove the electronic device 12, the locking arms 20 are deflected inwardly by applying pressure at the gripping portion 52 of the heads 36 of the locking arms. When the arms are deflected so that lower lip 44 of the notch 40 is cleared from the slot 66 formed within flange 58, the electronic device 12 and mount 14 may be pulled from the cradle 16, and any electronic cable connections may be released (e.g. unplugged). The device may be quickly and easily mounted and removed in a single motion as opposed to the prior art devices.

Figure 5:
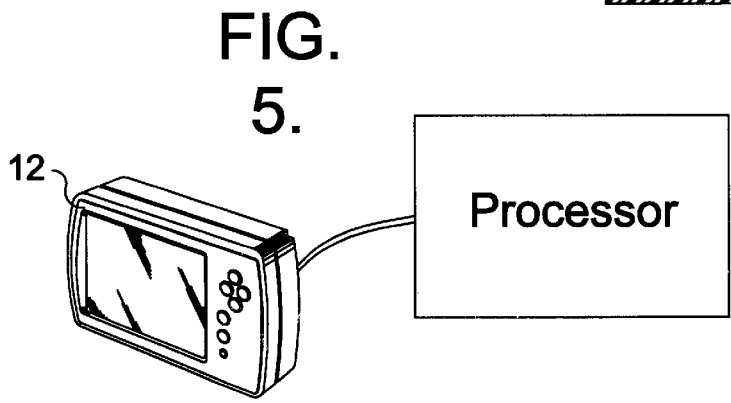
FIG. 5 is a perspective view of the electronic device interfacing with a processor when the device is removed from the dashboard of the vehicle.

As demonstrated in FIG. 5, once removed, the electronic device may be interfaced with a personal computer. Additionally, the mount may be used universally to releasably secure one electronic device in a plurality of different vehicles or a plurality of different types of devices in one vehicle.

From the foregoing it will be seen that this invention is one well adapted to attain all ends and objects herein above set forth together with the other advantages which are obvious and which are inherent to the structure.

It will be understood that certain features and subcombinations are of utility and may be employed without reference to other features and subcombinations. This is contemplated by and is within the scope of the claims.

Since many possible embodiments may be made of the invention without departing from the scope thereof, it is to be understood that all matter herein set forth or shown in the accompanying drawings is to be interpreted as illustrative, and not in a limiting sense.

What is claimed is:

1. A device for releasably mounting an electronic device to a surface, comprising:

a mount coupled with the electronic device, said mount having a plate with opposing ends and a pair of latch arms extending generally outwardly from said plate at said ends, each of said latch arms having an outer face, said face having a notch positioned across the width of said face, each of said latch arms biased outwardly when deflected in the direction of said plate;

a cradle, for coupling with the surface, having a pair of opposing side walls, said opposing side walls having a pair of receiving slots corresponding to said latch arms of said mount, wherein said notches of said latch arms receive a portion of said sidewalls when said latch arms are placed within said slots so that said mount is releasably secured in said cradle.

2. The device of claim 1 wherein said side walls further comprise a flange at the terminal end of the walls wherein said notches of said latch arms receive a portion of said flange when said latch arms are placed within said slots so that said mount is releasably secured in said cradle.

3. The device according to claim 1 wherein each of said latch arms has a stem and a head, said stem extending from said base to said notch, said head formed on the said arm opposite said stem.

4. The device according to claim 3 wherein said head includes a grasping surface.

5. The device according to claim 4 wherein said grasping surface is generally inwardly concave.

6. The device according to claim 3 wherein the stem has a tapered cross section.

7. The device according to claim 2 wherein said flange is substantially coplanar with the surface.

8. The device of claim 1 wherein each of said latch arms has a generally rectangular cross section and each said slot has a generally rectangular cross section.

9. The device of claim 1 wherein said mount is formed integrally with the electronic device.

10. The device of claim 1 wherein said mount is coupled with the electronic device by at least two screws.

11. The device of claim 1 wherein such said slot extends into flange wherein each said notch receives a portion of said flange inwardly from said side wall.

* * * * *

UNITED STATES PATENT AND TRADEMARK OFFICE
CERTIFICATE OF CORRECTION

PATENT NO.    : 6,370,037 B1
DATED         : April 9, 2002
INVENTOR(S)   : Brian G. Schoenfish It is certified that error appears in the above-identified patent and that said Letters Patent is hereby corrected as shown below:

<u>Title page,</u>
Item [54], the title is corrected to read -- RELEASABLE MOUNT FOR AN ELECTRONIC DEVICE --

Signed and Sealed this

Third Day of September, 2002

Attest:

Attesting Officer

JAMES E. ROGAN
*Director of the United States Patent and Trademark Office*